United States Patent
Takahashi et al.

(10) Patent No.: US 8,025,987 B2
(45) Date of Patent: Sep. 27, 2011

(54) LIGHT EMITTING POLYMER MATERIAL, ORGANIC ELECTROLUMINESCENCE DEVICE AND DISPLAY DEVICE COMPRISING LIGHT EMITTING POLYMER MATERIAL

(75) Inventors: Yoshiaki Takahashi, Chiba (JP); Tetsuhiko Yamaguchi, Chiba (JP)

(73) Assignee: Showa Denko K.K., Tokyo (JP)

( * ) Notice: Subject to any disclaimer, the term of this patent is extended or adjusted under 35 U.S.C. 154(b) by 644 days.

(21) Appl. No.: 11/917,256

(22) PCT Filed: Jun. 12, 2006

(86) PCT No.: PCT/JP2006/312196
§ 371 (c)(1),
(2), (4) Date: Dec. 12, 2007

(87) PCT Pub. No.: WO2006/135076
PCT Pub. Date: Dec. 21, 2006

(65) Prior Publication Data
US 2009/0096353 A1   Apr. 16, 2009

Related U.S. Application Data

(60) Provisional application No. 60/692,569, filed on Jun. 22, 2005.

(30) Foreign Application Priority Data

Jun. 14, 2005   (JP) .................................. 2005-173883

(51) Int. Cl.
*H01J 1/63* (2006.01)
*C08G 83/00* (2006.01)

(52) U.S. Cl. ............. 428/690; 428/917; 313/504; 528/9

(58) Field of Classification Search .................. None
See application file for complete search history.

(56) References Cited

U.S. PATENT DOCUMENTS

| | | | |
|---|---|---|---|
| 2001/0019782 A1* | 9/2001 | Igarashi et al. | 428/690 |
| 2003/0091862 A1* | 5/2003 | Tokito et al. | 428/690 |
| 2003/0186080 A1 | 10/2003 | Kamatani et al. | |
| 2004/0142208 A1 | 7/2004 | Hamada et al. | |

FOREIGN PATENT DOCUMENTS

| | | |
|---|---|---|
| EP | 1 371 708 A1 | 12/2003 |
| JP | 2003-206320 A | 7/2003 |
| JP | 2003-342325 | 12/2003 |
| JP | 2004-27088 | 1/2004 |
| WO | 02/064700 A1 | 8/2002 |
| WO | 2006/001150 A1 | 1/2006 |

* cited by examiner

*Primary Examiner* — Dawn L Garrett
*Assistant Examiner* — Andrew K Bohaty
(74) *Attorney, Agent, or Firm* — Sughrue Mion, PLLC

(57) ABSTRACT

Disclosed is a light emitting polymer material comprising a (co)polymer comprising a structural unit derived from an iridium complex represented by the following formula (1):

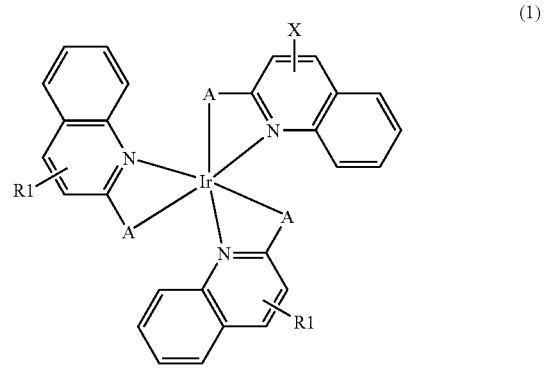

wherein $R^1$ and $R^2$ each independently represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group; $X^1$ represents a polymerizable functional group-containing substituent; and $A^1$ to $A^3$ each independently represents a divalent substituent having a cyclic structure.

6 Claims, 1 Drawing Sheet

LIGHT EMITTING POLYMER MATERIAL, ORGANIC ELECTROLUMINESCENCE DEVICE AND DISPLAY DEVICE COMPRISING LIGHT EMITTING POLYMER MATERIAL

CROSS-REFERENCE TO RELATED APPLICATIONS

This application is a National Stage of International Application No. PCT/JP2006/312196 filed on Jun. 12, 2006, claiming priority based on Japanese Patent Application No. 2005-173883 filed Jun. 14, 2005, which claims the benefit of U.S. Provisional Application No. 60/692,569 filed Jun. 22, 2005, under the provision of 35 U.S.C. Section 111(b), pursuant to 35 U.S.C. Section 119(e) (1), the contents of all of which are incorporated herein by reference in their entirety.

TECHNICAL FIELD

The present invention relates to a light emitting polymer material, to an organic electroluminescence device using the light emitting material and to a display device using the organic electroluminescence device. More specifically, the invention relates to a light emitting polymer material comprising a (co)polymer comprising a structural unit derived from an iridium complex, which is capable of highly efficiently emitting red to orange light with a high luminance brightness, and to uses thereof.

BACKGROUND ART

In recent years, for the purpose of enlarging the use of an organic electroluminescence device (sometimes referred to as "organic EL device" in this specification), the development of materials towards not only improvements of luminous efficiency and durability of the device but also full-color display, realization of a large area and mass production is actively carried out.

In order to realize full-color display, it is necessary to use materials capable of emitting monochromatic light of each of red, green and blue colors which are primaries (RGB). However, there was encountered a problem that any organic material capable of highly efficiently emitting red light with a high luminance brightness is not obtained.

Patent Document 1 discloses an iridium complex which is constituted of iridium and a quinoline derivative as a material capable of emitting red to orange light. According to Patent Document 1, an organic EL device is prepared by dispersing this iridium complex in a host material and forming a film by a vacuum vapor deposition method to obtain a light emitting layer.

However, the vacuum vapor deposition method involves a problem that not only a vacuum unit is required, but also in the case of a large-area device, the film thickness is liable to become non-uniform.

For that reason, if a light emitting layer could be formed by coating a solution of a light emitting material containing an organic solvent or water, not only the manufacturing step of an organic EL device is made simple, but also it is possible to realize a device with a large area. In this coating method, since a small light-emitting molecule which is liable to cause phase separation or segregation, there is made an attempt to obtain a light emitting polymer material which is free from such defects.

Also, for the purpose of efficiently causing recombination of a hole and an electron on a light emitting compound, thereby designing to improve luminous efficiency, there is also made an attempt to obtain a light emitting polymer material resulting from copolymerization of a light emitting compound and a hole transport compound and/or an electron transport compound.

For example, an organic EL device is prepared by using, as the light emitting polymer material, a copolymer comprising a structural unit derived from an iridium complex, a carbazole derivative, and an oxadiazole derivative. In such an device, in the case where an iridium complex having a phenylpyridine derivative coordinated therein is used, green light emission is observed (see Patent Document 2); and in the case where an iridium complex in which an acetylacetone derivative bound to the polymer main chain and a quinoline derivative are coordinated is used, red light emission is observed (see Patent Document 3).

However, for the purpose of achieving practical application of light emitting polymer materials, it has been desired to develop a durable light emitting polymer material which is able to highly efficiently emit red light with a high luminance brightness and to simplify the manufacturing step of an organic EL device.

[Patent Document 1] WO 2002/064700
[Patent Document 2] JP-A-2003-342325
[Patent Document 3] JP-A-2004-27088

DISCLOSURE OF THE INVENTION

It is an object of the present invention to provide a light emitting polymer material from which red to orange light with a high luminance brightness is obtained in high luminous efficiency. It is another object of the present invention to provide an organic EL device and a display device in which the manufacturing step of an organic EL device is simplified and which has excellent durability and is able to realize a large area.

The present inventors have diligently studied to solve the above problems, and as a result, they have found that red to orange light with a high luminance brightness can be obtained in high luminous efficiency by a light emitting polymer material comprising a (co)polymer containing a structural unit derived from a specific iridium complex. Based on the finding, the present invention has been accomplished.

The present invention concerns the following [1] to [12]

[1] A light emitting polymer material comprising a (co)polymer comprising a structural unit derived from an iridium complex represented by the following formula (1):

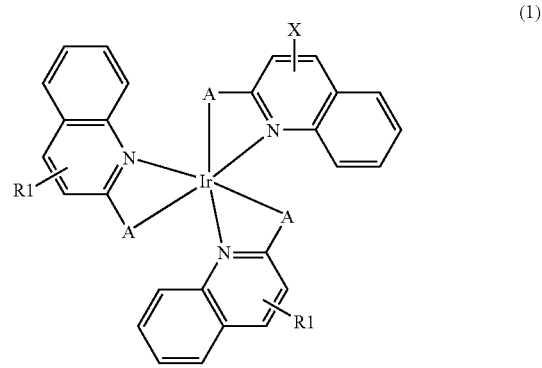

wherein $R^1$ and $R^2$ each independently represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group; $X^1$ represents a polymerizable functional group-containing substituent; and $A^1$ to $A^3$ each independently represents a divalent substituent having a cyclic structure.

[2] The light emitting polymer material as described in [1], wherein $A^1$ to $A^3$ are each independently selected from the group consisting of divalent substituents having a cyclic structure represented by the following formulae (A1) to (A7):

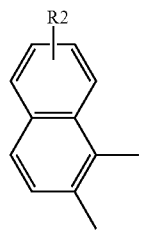
(A1)

(A2)
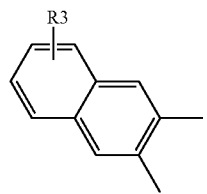

(A3)
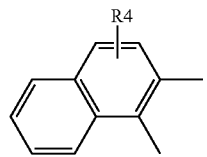

(A4)
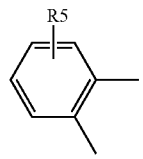

(A5)
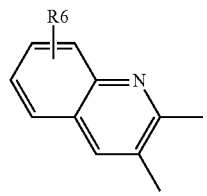

(A6)
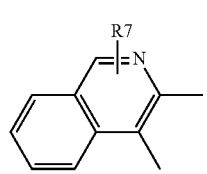

(A7)
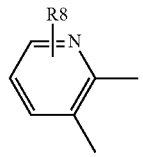

wherein $R^3$ to $R^9$ are each synonymous with $R^1$ in the formula (1).

[3] A light emitting polymer material comprising a (co)polymer comprising a structural unit derived from an iridium complex represented by the following formula (2):

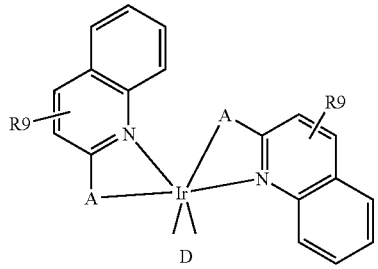
(2)

wherein D represents a bidentate ligand of a monovalent anion having a polymerizable functional group; $R^{10}$ and $R^{11}$ each independently represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group; and $A^4$ and $A^5$ each independently represents a divalent substituent having a cyclic structure.

[4] The light emitting polymer material as described in [3], wherein D represents a bidentate ligand represented by the following formula (D1):

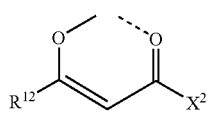
(D1)

wherein $R^{12}$ represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group; and $X^2$ represents a polymerizable functional group-containing substituent.

[5] The light emitting polymer material as described in [3], wherein D represents a bidentate ligand represented by the following formula (D2):

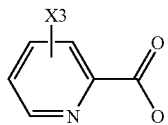
(D2)

wherein X³ represents a polymerizable functional group-containing substituent.

[6] The light emitting polymer material as described in [3], wherein D represents a bidentate ligand represented by the following formula (D3):

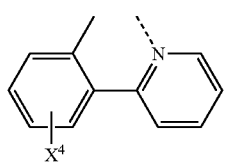
(D3)

wherein X⁴ represents a polymerizable functional group-containing substituent.

[7] The light emitting polymer material as described in any one of [3] to [6], wherein A⁴ and A⁵ are each independently selected from the group consisting of divalent substituents having a cyclic structure represented by the formulae (A1), (A2), (A4), (A5) and (A7):

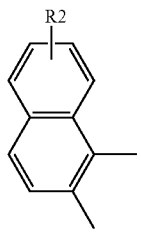
(A1)

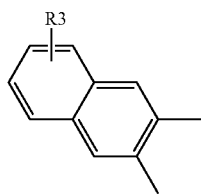
(A2)

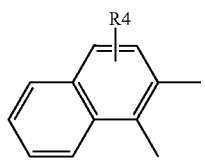
(A3)

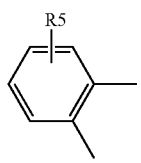
(A4)

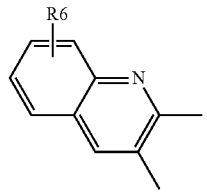
(A5)

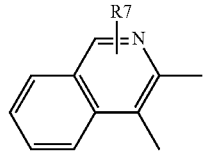
(A6)

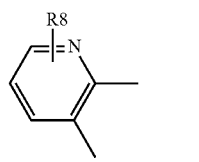
(A7)

wherein R³, R⁴, R⁶, R⁷ and R⁹ each independently represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group.

[8] The light emitting polymer material as described in any one of [1] to [7], wherein the (co)polymer further comprises a structural unit derived from at least one hole transport polymerizable compound.

[9] The light emitting polymer material as described in anyone of [1] to [8], wherein the (co)polymer further comprises a structural unit derived from at least one electron transport polymerizable compound.

[10] An organic EL device comprising one layer or two or more layers of an organic polymer compound layer interposed between an anode and a cathode, wherein at least one of the organic polymer compound layers comprises the light emitting polymer material as described in any one of [1] to [9].

[11] An image display device comprising the organic EL device as described in [10].

[12] An area light source comprising the organic EL device as described in [10].

EFFECT OF THE INVENTION

According to the light emitting polymer material according to the invention, not only red to orange light with a high luminance brightness is obtained in high luminous efficiency, but also it is possible to provide an organic EL device and a display device in which the manufacturing step of an organic EL device is simplified and which has excellent durability and is able to realize a large area.

BEST MODES FOR CARRYING OUT THE INVENTION

Figure 1:
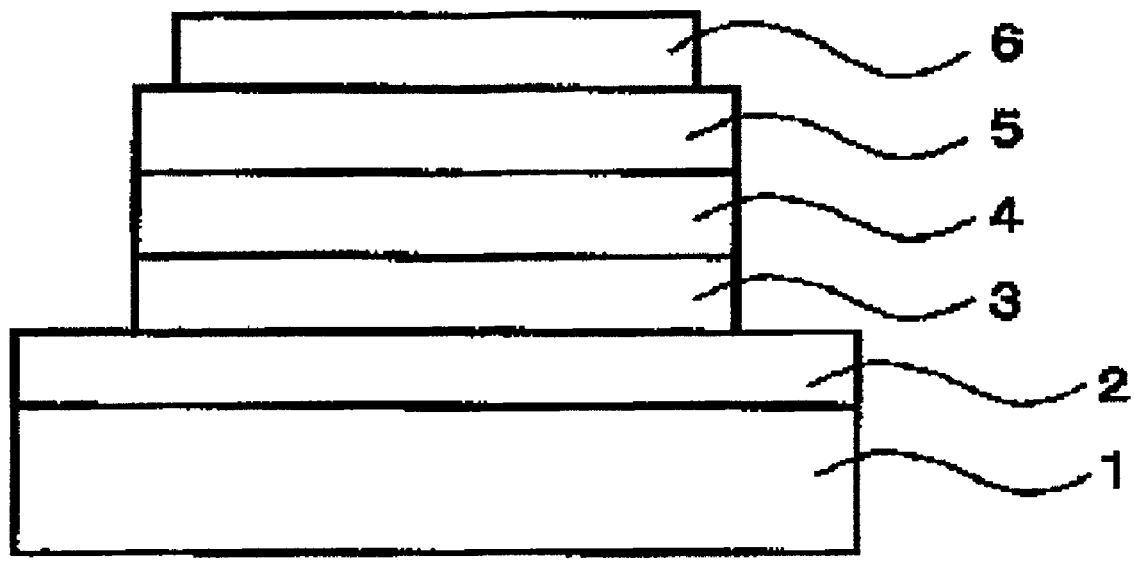
FIG. 1 shows a cross-sectional view of an example of the organic EL device of the invention.
1: Glass substrate
2: Anode
3: Hole transport layer
4: Light emitting layer
5: Electron transport layer
6: Cathode

The invention will be specifically described hereinafter.

<(Co)Polymer Comprising a Structural Unit Derived from an Iridium Complex>

The light emitting polymer material according to the invention is a (co)polymer obtained by (co)polymerizing one or two or more monomers of an iridium complex. The iridium complex is represented by the formula (1) or (2). Incidentally, the "(co)polymer comprising a structural unit derived from an iridium complex" as referred to in the invention represents a homopolymer of the iridium complex or a copolymer of two or more iridium complexes.

In the light emitting polymer material, since the monomer of the iridium complex is (co)polymerized, light emission via a triplet excited state of the iridium complex is obtained. That is, in the case where the light emitting polymer material is comprised in the light emitting layer of the organic EL device, light emission from a triplet excited state which is usually difficult for use can be obtained in high efficiency. Furthermore, in the (co)polymer comprising a structural unit derived from the iridium complex represented by the formula (1) or (2), red to orange light with a high luminance brightness is obtained in high luminous efficiency.

In the formula (1), $R^1$ and $R^2$ each independently represents an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted with an alkyl group of 1 to 10 carbon atoms, an alkoxy group of 1 to 10 carbon atoms, and a silyl group.

Examples of the halogen atom include a fluorine atom, a chlorine atom, a bromine atom, and an iodine atom.

Examples of the alkyl group of 1 to 10 carbon atoms include a methyl group, an ethyl group, a propyl group, an isopropyl group, a butyl group, an isobutyl group, a t-butyl group, an amyl group, a hexyl group, an octyl group, and a decyl group.

Examples of the aryl group of 6 to 10 carbon atoms include a phenyl group, a tolyl group, a xylyl group, a mesityl group, and a naphthyl group.

Examples of the amino group which may be substituted with an alkyl group of 1 to 10 carbon atoms include an amino group, a dimethylamino group, a diethylamino group, and a dibutylamino group.

Examples of the alkoxy group of 1 to 10 carbon atoms include a methoxy group, an ethoxy group, a propoxy group, an isopropoxy group, a butoxy group, an isobutoxy group, a t-butoxy group, a hexyloxy group, a 2-ethylhexyloxy group, and a decyloxy group.

Examples of the silyl group include a trimethylsilyl group, a triethylsilyl group, and a t-butyldimethylsilyl group.

Above all, a hydrogen atom, a fluorine atom, an alkyl group of 1 to 4 carbon atoms, a phenyl group, a tolyl group, a dimethylamino group, and an alkoxy group of 1 to 4 carbon atoms are preferable because of easiness of the production of a monomer of the iridium complex and easiness of the control of solubility of the complex in a solvent and emission wavelength; and a hydrogen atom, a fluorine atom, a t-butyl group, a dimethylamino group, and a methoxy group are more preferable because the production of a monomer of the iridium complex is especially easy.

In the formula (1), $X^1$ represents a polymerizable functional group-containing polymerizable substituent.

The polymerizable substituent is not particularly limited so far as it contains the polymerizable functional group. The polymerizable functional group may be capable of any of radical polymerization, cationic polymerization, anionic polymerization, addition polymerization, or condensation polymerization. Of these, a radical polymerizable functional group is preferable because of easiness of the production of a (co)polymer.

Examples of the polymerizable functional group include an allyl group, an alkenyl group, an acrylate group, a methacrylate group, a urethane (meth)acrylate group such as a methacryloyloxyethyl carbamate group, a vinylamide group, and derivatives thereof.

In the case where the polymerizable functional group is an alkenyl group, substituents represented by the following formulae (E1) to (E11) are preferable as the polymerizable functional group.

(E1)

(E2)

(E3)

(E4)

(E5)

(E6)

(E7)

(E8)

-continued

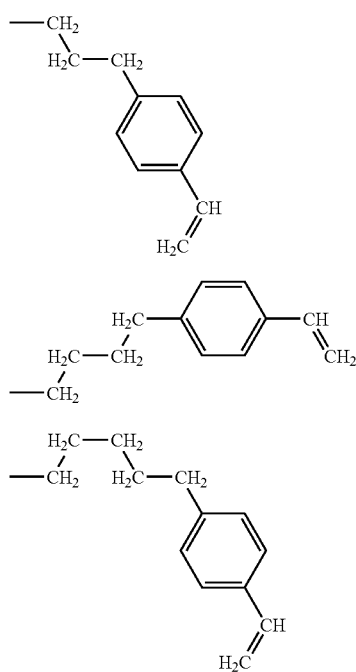

Of these, the substituents represented by the formulae (E1) and (E5) are more preferable because the polymerizable substituent can be easily introduced into the iridium complex.

In the formula (1), $A^1$ to $A^3$ each independently represents a divalent substituent having a cyclic structure.

It is preferable that $A^1$ to $A^3$ each independently represents a divalent substituent having any one of the cyclic structures represented by the formulae (A1) to (A7) because the excited state of the iridium complex is stabilized and the durability of the light emitting polymer material is improved. Above all, the divalent substituent having the cyclic structure represented by the formula (A4) is more preferable because the stabilization and the durability are more excellent.

In the formulae (A1) to (A7), $R^3$ to $R^9$ are each synonymous with $R^1$ in the formula (1), and preferred ranges thereof are also the same.

In the formula (2), $R^{10}$ and $R^{11}$ are each synonymous with $R^1$ in the formula (1), and preferred ranges thereof are also the same.

In the formula (2), D represents a bidentate ligand of a monovalent anion having a polymerizable functional group.

Examples of the polymerizable functional group include functional groups the same as those which $X^1$ can have.

Examples of the bidentate ligand of a monovalent anion include a ligand which is a monovalent anion as a result of elimination of one proton from a compound having a structure such that a conjugated structure containing two coordination sites is able to become monovalent anionic as a whole upon elimination of one proton; and a ligand containing a nonionic coordination site such as a pyridine ring, a carbonyl group and an imine group, and a site which is a monovalent anionic coordination site as a result of elimination of one proton of a hydroxyl group, a carboxyl group, a phenyl group or the like. The ligand is substituted with the functional group-containing substituent, for example, the substituents represented by the formulae (E1) to (E11).

As the bidentate ligand of a monovalent anion, the bidentate ligand represented by the formula (D1), (D2) or (D3) is preferable. When two coordination sites are coordinated to one iridium atom, such a ligand forms a 5-membered ring or 6-membered ring structure including the iridium atom. For that reason, the ligand can be stably coordinated to the iridium atom.

In the formula (D1), $R^{12}$ is synonymous with $R^1$ in the formula (1), and preferred ranges thereof are also the same.

$X^2$ in the formula (D1), $X^3$ in the formula (D2) and $X^4$ in the formula (D3) are each synonymous with $X^1$ in the formula (1), and preferred ranges thereof are also the same.

Examples of the bidentate ligand represented by the formula (D1) include a ligand which is a monovalent anion as a result of elimination of one proton from a 2,4-pentanedione derivative.

In the formula (2), $A^4$ and $A^5$ each independently represents a divalent substituent having a cyclic structure.

It is preferable that $A^4$ and $A^5$ each independently represents a divalent substituent having any one of the cyclic structures represented by the formulae (A2), (A4), (A5) and (A7) because the excited state of the iridium complex is stabilized and the durability of the light emitting polymer material is improved. Above all, the divalent substituent having the cyclic structure represented by the formula (A4) is more preferable because the stabilization and the durability are more excellent.

Of the iridium complexes represented by the formula (1) or (2), specifically, bis(2-(2-quinolyl)phenyl) (2-(6-vinyl-2-quinolyl)phenyl)iridium, bis(2-(2-quinolyl)phenyl) (6-(4-vinylphenyl)-2,4-hexanedionato)iridium and bis(5-t-butyl-2-(2-quinolyl)phenyl) (5-vinyl-2-(2-pyridyl)phenyl)iridium are especially preferable. A light emitting polymer material comprising a copolymer containing a structural unit derived from such a complex brings not only light emission with a high luminance brightness but also high luminous efficiency.

The iridium complex represented by the formula (1) or (2) can be, for example, produced in the following manner. First of all, a ligand of a quinoline derivative not containing a polymerizable functional group and 0.5 equivalents of an iridium compound are made to react with each other in a solvent. Subsequently, the resulting iridium complex and a ligand of a quinoline derivative containing a polymerizable functional group are made to react with each other in a solvent, to obtain the iridium complex represented by the formula (1) or (2).

A weight average molecular weight of the (co)polymer is in the range of preferably 1,000 to 2,000,000, and more preferably 5,000 to 1,000,000. The molecular weight as referred to herein is a molecular weight in terms of polystyrene as measured by GPC (gel permeation chromatography) method. When the molecular weight is in the above range, the (co)polymer is soluble in an organic solvent and a uniform thin film is obtained.

The (co) polymer may be any of a random copolymer, a block copolymer and an alternate copolymer.

As a polymerization method of the (co)polymer, all of radical polymerization, cationic polymerization, anionic polymerization and addition polymerization are employable. Of these, radical polymerization is preferable.

<Copolymer Containing a Structural Unit Derived from a Carrier Transport Polymerizable Compound>

It is preferable that the light emitting polymer material according to the invention comprises a copolymer obtained by copolymerizing one or two or more monomers of the iridium complex with one or two or more monomers of a carrier transport polymerizable compound. Examples of the carrier transport polymerizable compound include hole transport polymerizable compounds and electron transport polymerizable compounds. That is, it is preferable that the light emitting polymer material comprises a copolymer containing one or two or more structural units derived from a hole transport polymerizable compound or one or two or more structural units derived from an electron transport polymerizable compound, and a structural unit derived from the iridium complex. In such a light emitting polymer material, since a hole and an electron are efficiently recombined with each other on the structural unit derived from the iridium complex, an organic EL device having high luminous efficiency is obtained.

It is more preferable that the light emitting polymer material comprises a copolymer containing one or two or more structural units derived from a hole transport polymerizable compound, one or two or more structural units derived from an electron transport polymerizable compound and one or two or more structural units derived from the iridium complex. In such a light emitting polymer material, since a hole and an electron are more efficiently recombined with each other, an organic EL device having higher luminous efficiency is obtained. The light emitting polymer material is provided with all functions regarding light emission properties, hole transport properties and electron transport properties so that an organic EL device can be prepared without blending other organic material therewith. For that reason, not only the manufacturing step of an organic EL device can be made more simple, but also an organic EL device which is thermally stable and has excellent durability is obtained.

Examples of the hole transport polymerizable compound include compounds represented by the following formulae (E12) to (E17). Of these, compounds represented by the following formulae (E12) to (E14) are preferable because the carrier mobility in the copolymer is high.

(E12)

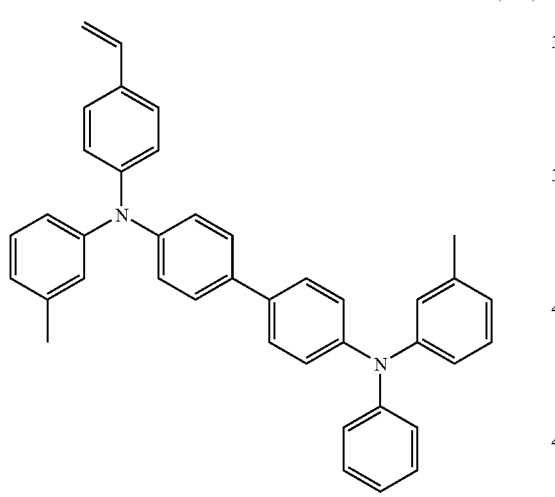

(E13)

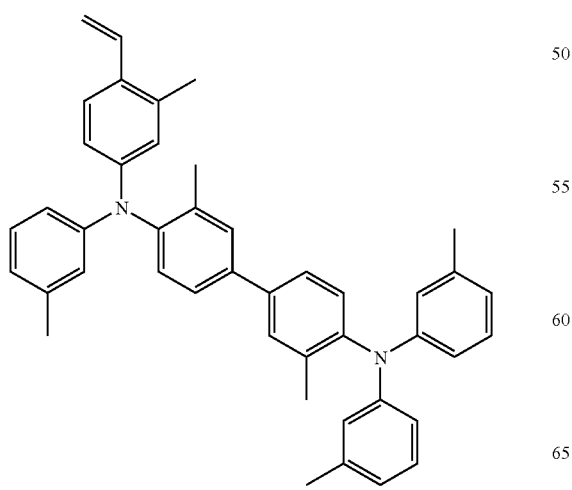

(E14)

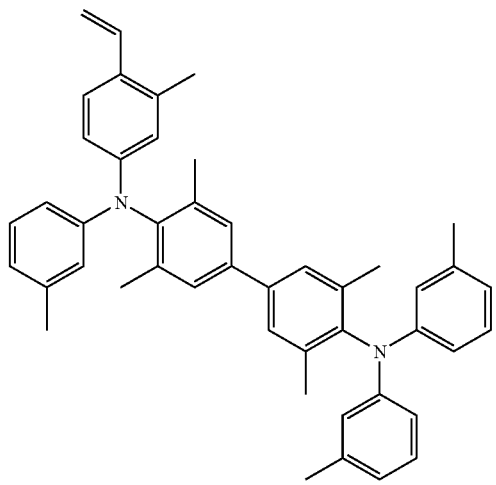

(E15)

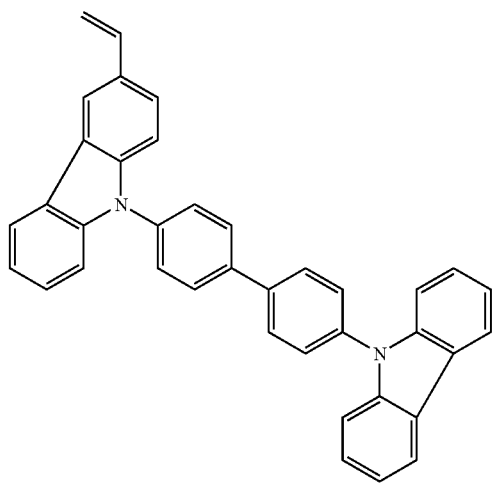

(E16)

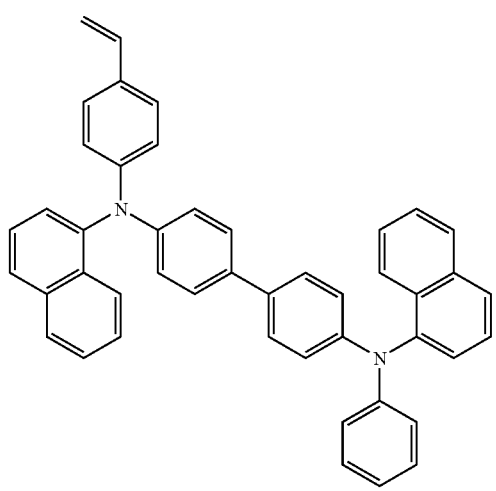

(E17)
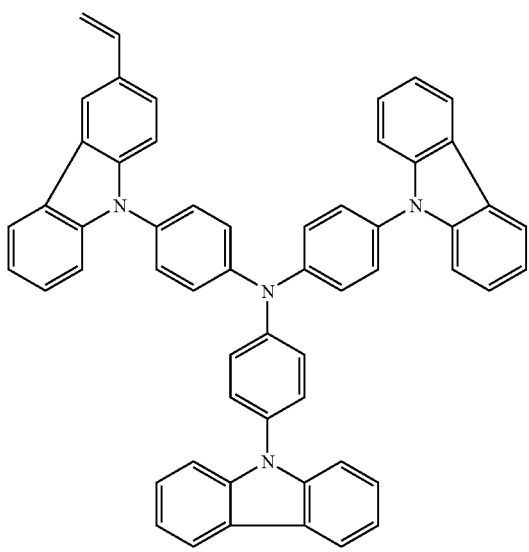
(E19)
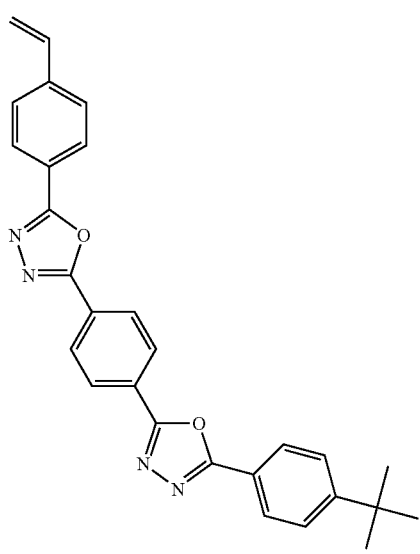
Examples of the electron transport polymerizable compound include compounds represented by the following formulae (E18) to (E25). Of these, compounds represented by the formulae (E18) and (E23) to (E25) are preferable because the carrier mobility in the copolymer is high.
(E20)
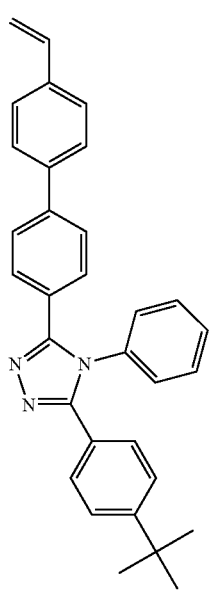
(E18)
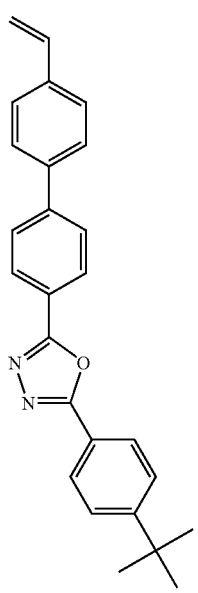
(E21)
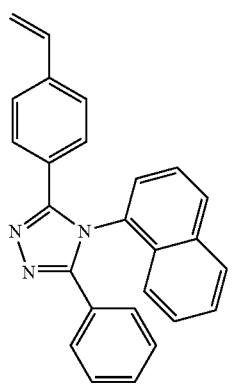

-continued

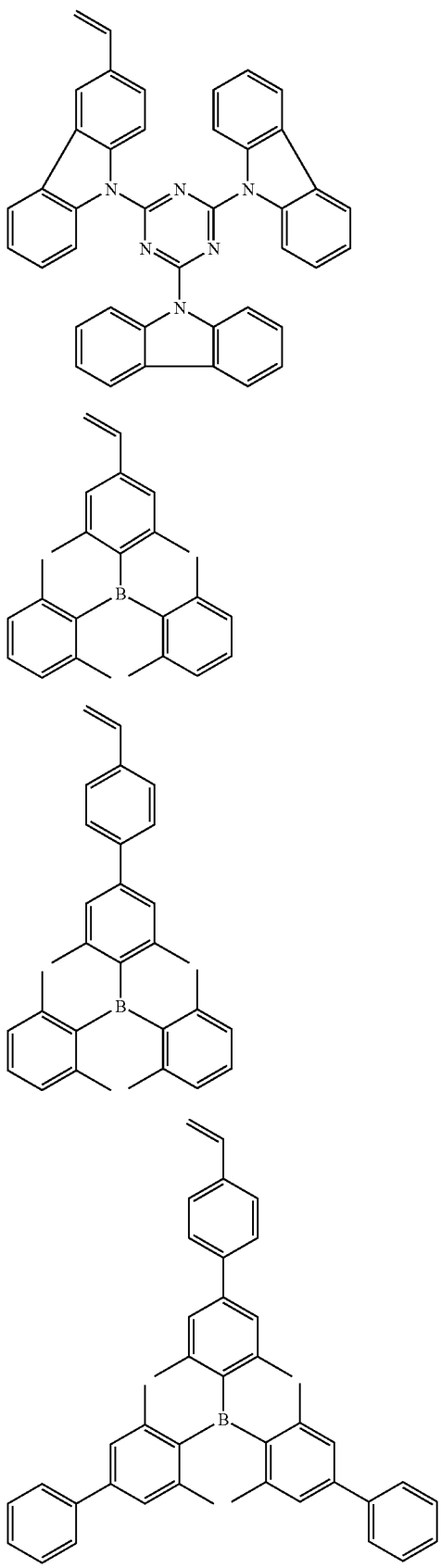

(E22)

(E23)

(E24)

(E25)

The polymerizable substituent which each of the hole transport polymerizable compound or the electron transport polymerizable compound has may be the polymerizable substituent represented by the formula (E1) as shown by the formulae (E12) to (E25) or the polymerizable substituent represented by each of the formulae (E2) to (Eli). Of these, the polymerizable substituents represented by the formulae (E1) and (E5) are preferable because the polymerizable substituent can be easily introduced into the carrier transport polymerizable compound.

In the formulae (E1) to (E11), the polymerizable functional group (alkenyl group) may be substituted with, for example, an allyl group, an acrylate group, a methacrylate group, a urethane (meth)acrylate group such as a methacryloyloxyethyl carbamate group, a vinylamide group, or a derivative thereof.

Above all, it is especially preferable that the copolymer contains a structural unit derived from the iridium complex, a structural unit derived from a compound represented by any one of the formulae (E12) to (E14) as the hole transport polymerizable compound, and a structural unit derived from a compound represented by any one of the formulae (E18) and (E23) to (E25) as the electron transport polymerizable compound. A light emitting polymer material comprising such a copolymer is desired because it has high durability and high luminous efficiency. In this case, as the iridium complex, bis(2-(2-quinolyl)phenyl) (2-(6-vinyl-2-quinolyl)phenyl)iridium, bis(2-(2-quinolyl)phenyl) (6-(4-vinylphenyl)-2,4-hexanedionato)iridium and bis(5-t-butyl-2-(2-quinolyl)phenyl) (5-vinyl-2-(2-pyridyl)phenyl)iridium are preferable, and bis (5-t-butyl-2-(2-quinolyl)phenyl) (5-vinyl-2-(2-pyridyl)phenyl)iridium is particularly preferable, because not only light emission with a high luminance brightness but also higher luminous efficiency is obtained.

A weight average molecular weight of the copolymer is in the range of preferably 1,000 to 2,000,000, and more preferably 5,000 to 1,000,000. When the molecular weight is in the above range, because the (co)polymer is soluble in an organic solvent and a uniform thin film is obtained.

The (co)polymer may be any of a random copolymer, a block copolymer or an alternate copolymer.

In the copolymer, when the number of a unit derived from the iridium complex is designated as "m" and the number of a unit derived from the carrier transport compound (the total number of a unit derived from the hole transport polymerizable compound and/or the electron transport polymerizable compound) is designated as "n" (m and n are each an integer of 1 or more), a proportion of the number of a unit derived from the iridium complex to the total number of units, namely a value of {m/(m+n)} is in the range of preferably 0.001 to 0.5, and more preferably 0.001 to 0.2. When the value of {m/(m+n)} is in the above range, an organic EL device having a high carrier mobility, less influences of concentration quenching and high luminous efficiency is obtained.

Furthermore, in the case the (co)polymer comprises a structural unit derived from the hole transport polymerizable compound and a structural unit derived from the electron transport polymerizable compound, the number of a unit derived from the hole transport polymerizable compound (x) and the number of a unit derived from the electron transport polymerizable compound (y) satisfy the following relationship:

$$n = x + y$$

(x and y are each an integer of 1 or more). Optimal values of a ratio of the number of a structural unit derived from the hole transport polymerizable compound to the number of a structural unit derived from the carrier transport polymerizable compound (x/n) and a ratio of the number of a structural unit derived from the electron transport polymerizable compound to the number of a structural unit derived from the carrier transport polymerizable compound (y/n) vary each depending on an electron transport ability of each of the structural units, the concentration of a structural unit derived from the iridium complex or the like. When a light emitting layer is composed of the (co)polymer singularly, the values of x/n and y/n are independently in the range of preferably 0.05 to 0.95, and more preferably 0.20 to 0.80 with the proviso that x/n+y/n=1.

As a polymerization method of the copolymer, all of radical polymerization, cationic polymerization, anionic polymerization and addition polymerization are employable. Of these, radical polymerization is preferable.

<Organic EL Device>

It is preferable that the light emitting polymer material according to the invention is used as a material of an organic EL device. The organic EL device comprises one or two or more layers of an organic polymer compound layer interposed between an anode and a cathode, and at least one of the organic polymer compound layers comprises the light emitting polymer material. The light emitting polymer material according to the invention has an advantage that a light emitting layer can be formed by a simple coating method. Furthermore, in the case where the light emitting polymer material comprises a copolymer comprising not only a structural unit derived from the iridium complex but also a structural unit derived from the hole transport polymerizable compound and a structural unit derived from the electron transport polymerizable compound, an organic EL device can be prepared without blending other organic material therewith. For that reason, not only the manufacturing step of an organic EL device can be made simpler, but also an device has high stability and durability.

One example of the constitution of the organic EL device according to the invention is shown in FIG. 1, but it should not be construed that the constitution of the organic EL device according to the invention is limited thereto. In FIG. 1, a hole transport layer (3), a light emitting layer (4) and an electron transport layer (5) are formed in this order between an anode (2) on a transparent substrate (1) and a cathode (6). In the organic EL device, for example, any one of 1) hole transport layer/light emitting layer; and 2) light emitting layer/electron transport layer may be formed between the anode (2) and the cathode (6). Furthermore, only one layer of any one of 3) a layer containing a hole transport material, a light emitting material and an electron transport material; 4) a layer containing a hole transport material and a light emitting material; 5) a layer containing a light emitting material and an electron transport material; and 6) a single layer of a light emitting material may be formed. In addition, two or more layers of the light emitting layer may be laminated.

For the purpose of compensating the carrier transport properties of the light emitting layer, the light emitting layer in the organic EL device according to the invention may contain a hole transport material and/or an electron transport material in addition to the light emitting polymer material according to the invention. Such a transport material may be a low molecular weight compound or a polymer compound.

Examples of the hole transport material which forms the hole transport layer or the hole transport material which is mixed in the light emitting layer include non-polymeric triphenylamine derivatives such as TPD (N,N'-dimethyl-N,N'-(3-methylphenyl)-1,1'-biphenyl-4,4'-diamine), α-NPD (4,4'-bis[N-(1-naphthyl)-N-phenylamino]biphenyl), and m-MTDATA (4,4',4"-tris(3-methylphenylphenylamino) triphenylamine); polyvinylcarbazole; polymer compounds which is obtained by polymerizing the triphenylamine derivatives with a polymerizable functional group; and fluorescent light emitting polymer compounds such as poly-p-phenylenevinylene and polydialkylfluorenes. Examples of the polymer compound include polymer compounds having a triphenylamine skeleton as disclosed in JP-A-8-157575. The hole transport material can be used singly or in combination of two or more kinds, and a different hole transport material may also be laminated and used. Since the thickness of the hole transport layer depends on the conductivity of the hole transport layer and the like, it cannot be unequivocally limited. However, it is in the range of preferable 1 nm to 5 μm, more preferably 5 nm to 1 μm, and especially preferably 10 nm to 500 nm.

Examples of the electron transport material which forms the electron transport layer or the electron transport material which is mixed in the light emitting layer include non-polymeric compounds such as quinolinol derivative metal complexes such as Alq3 (aluminum trisquinolinolate), oxadiazole derivatives, triazole derivatives, imidazole derivatives, triazine derivatives, and triarylborane derivatives; and polymer compounds which is obtained by polymerizing the low molecular weight electron transport material with a polymerizable functional group. Examples of the polymer compound include poly-PBD as disclosed in JP-A-10-1665. The electron transport material can be used singly or in combination of two or more kinds, and a different electron transport material may also be laminated and used. Since the thickness of the electron transport layer depends on the conductivity of the electron transport layer and the like, it cannot be unequivocally limited. However, it is in the range of preferable 1 nm to 5 μm, more preferably 5 nm to 1 μm, and especially preferably from 10 nm to 500 nm.

With respect to the light emitting material, the hole transport material and the electron transport material which are used in the respective layers, the respective layers may be formed individually or may be formed by mixing materials having a different function from each other. Furthermore, the respective layers can be formed by mixing a polymer material as a binder. Examples of the polymer material include polymethyl methacrylate, polycarbonates, polyesters, polysulfones, and polyphenylene oxide.

For the purposes of suppressing passage of a hole through the light emitting layer and efficiently recombining it with an electron within the light emitting layer, a hole block layer may be formed adjacent to the cathode side of the light emitting layer. In order to form this hole block layer, known materials such as triazole derivatives, oxadiazole derivatives, and phenanthroline derivatives can be used.

For the purpose of relieving injection barrier in hole injection, a buffer layer may be formed between the anode and the hole transport layer or between the anode and an organic layer laminated adjacent to the anode. In order to form this buffer layer, known materials such as copper phthalocyanine, a mixture of polyethylenedioxythiophene and polystyrenesulfonic acid (PEDOT:PSS) can be used.

For the purpose of improving the electron injection efficiency, an insulating layer having a thickness of from 0.1 to 10 nm may be formed between the cathode and the electron transport layer or between the cathode and an organic layer laminated adjacent to the cathode. In order to form this insulating layer, known materials such as lithium fluoride, magnesium fluoride, magnesium oxide, and alumina can be used.

Examples of the film-forming process of the hole transport layer, light emitting layer and electron transport layer include resistance heating vapor deposition, electron beam vapor deposition, sputtering, inkjet printing, spin coating, printing, spray coating, and dispensing. In the case of a low molecular weight compound, resistance heating vapor deposition or electron beam vapor deposition is suitably employed; and in the case of a polymer material, inkjet printing, spin coating or printing is suitably employed.

In the case where the light emitting layer is formed of the light emitting polymer material according to the invention, since inkjet printing, spin coating, dip coating, or a printing can be employed, it is possible to make the manufacturing step simple.

As an anode material which is used in the organic EL device according to the invention, known transparent conductive materials such as ITO (indium tin oxide), tin oxide, zinc oxide, and conductive polymer compounds such as polythiophene, polypyrrole, and polyaniline can be used. It is preferable that an electrode formed from this transparent conductive material has a surface resistance of 1 to 50 Ω/□ (ohm/square). Examples of the film-forming process of the anode material include electron beam vapor deposition, sputtering, chemical reaction, and coating. The anode preferably has a thickness of 50 to 300 nm.

As a cathode material which is used in the organic EL device according to the invention, known cathode materials such as alkali metals such as Li, Na, K, and Cs; alkaline earth metals such as Mg, Ca, and Ba; Al; MgAg alloys; and alloys of Al and an alkali metal or an alkaline earth metal such as AlLi and AlCa can be used. Examples of the film-forming method of the cathode material include resistance heating vapor deposition, electron beam vapor deposition, sputtering, and ion plating. A thickness of the cathode is preferably 10 nm to 1 μm, and more preferably 50 to 500 nm. In the case of using, as the cathode, a highly active metal such as alkali metals, a thickness of the cathode is in the range of preferably 0.1 to 100 nm, and more preferably 0.5 to 50 nm. Furthermore, in this case, for the purpose of protecting the cathode metal, a metal layer which is stable in air is laminated on this cathode. Examples of a metal for forming the metal layer include Al, Ag, Au, Pt, Cu, Ni, and Cr. A thickness of the metal layer is in the range of preferably 10 nm to 1 μm, and more preferably 50 to 500 nm.

As a substrate of the organic EL device according to the invention, an insulating substrate which is transparent to the emission wavelength of the light emitting material can be used. As the insulating substrate, transparent plastics such as PET (polyethylene terephthalate) and polycarbonates can be used as well as glass.

The organic EL device according to the invention can favorably provide a pixel by a matrix system or a segment system by known methods. Furthermore, the organic EL device can also favorably provide an area light source without forming a pixel.

<Use>

The light emitting polymer material and the organic EL device using the light emitting polymer material according to the invention can be suitably used for display devices, displays, backlights, electrophotography, illumination light sources, recording light sources, exposure light sources, write light sources, sings, signboards, interiors, optical communication, and so on.

The present invention is further described with reference to the following Examples, but it should be construed that the invention is in no way limited to those Examples.

EXAMPLES

Synthesis Example 1

Synthesis of bis(2-(2-quinolyl)phenyl) (2-(6-vinyl-2-quinolyl)phenyl)iridium (Compound (I))

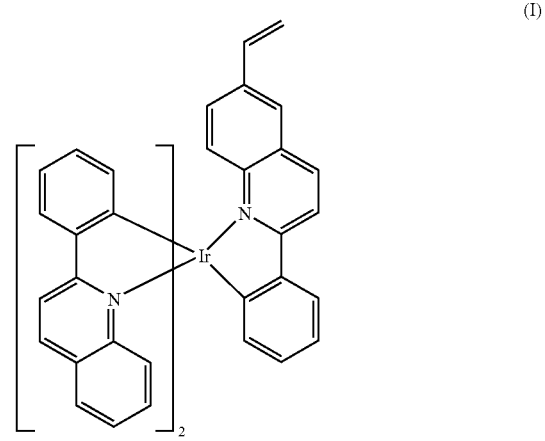

To a mixture of 0.68 g (1.9 mmoles) of iridium trichloride trihydrate and 0.80 g (3.9 mmoles) of 2-phenylquinoline, 15 mL of 2-ethoxyethanol and 5 mL of water were added, and the mixture was refluxed under heating for 12 hours. A formed precipitate was washed with methanol and dried in vacuo. To a mixture of 0.30 g of the resulting solid and 0.11 g (0.48 mmoles) of 2-phenyl-6-vinylquinoline, 50 mL of toluene and 0.123 g (49 mmoles) of silver trifluoromethanesulfonate were added, and the mixture was refluxed under heating for 12 hours. The resulting reaction mixture was filtered by Celite, and the solvent was distilled off. The resulting solid was purified by silica gel column chromatography (eluting solution: chloroform) to obtain 0.04 g (0.05 mmoles) of Compound (I).

FAB-MS: 831 (M$^+$). Elemental analysis: Calculated for $C_{47}H_{32}IrN_3$: C, 67.93; H, 3.88; N, 5.06. Found: C, 68.32; H, 3.59; N, 5.02.

Synthesis Example 2

Synthesis of bis(2-(2-quinolyl)phenyl) (6-(4-vinylphenyl)-2,4-hexanedionato)iridium (Compound (II))

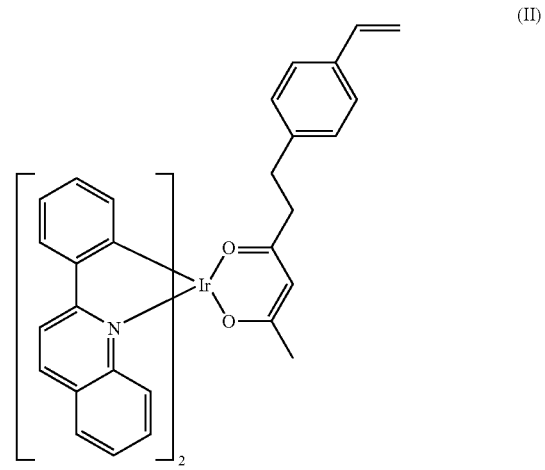

To a mixture of 0.68 g (1.9 mmoles) of iridium trichloride trihydrate and 0.80 g (3.9 mmoles) of 2-phenylquinoline, 15 mL of 2-ethoxyethanol and 5 mL of water were added, and the mixture was refluxed under heating for 12 hours. A formed precipitate was washed with methanol and dried in vacuo. To a mixture of 0.30 g of the resulting solid and 0.20 g (0.92 mmoles) of 6-(4-vinylphenyl)-2,4-hexanedione, 10 mL of N,N-dimethylformamide and 0.14 g (1.0 mmole) of potassium carbonate were added, and the mixture was stirred at 100° C. for 12 hours. The resulting reaction mixture was thrown into 200 mL of water, and a formed precipitate was washed with water and dried in vacuo. The resulting solid was purified by silica gel column chromatography (eluting solution: chloroform) to obtain 0.18 g (0.22 mmoles) of Compound (II).

FAB-MS: 816 ($M^+$). Elemental analysis: Calculated for $C_{45}H_{34}IrN_3O_2$: C, 64.77; H, 4.32; N, 3.43. Found: C, 64.50; H, 4.48; N, 3.56.

Synthesis Example 3

Synthesis of bis(5-t-butyl-2-(2-quinolyl)phenyl) (5-vinyl picolinate)iridium (Compound (III))

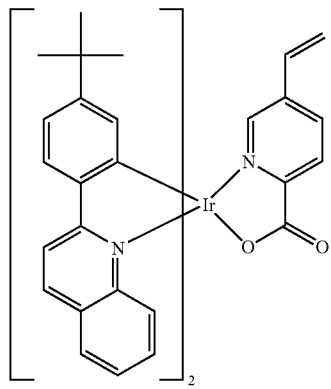

(III)

To a mixture of 0.68 g (1.9 mmoles) of iridium trichloride trihydrate and 1.1 g (4.2 mmoles) of 2-(4-t-butylphenyl) quinoline, 15 mL of 2-ethoxyethanol and 5 mL of water were added, and the mixture was refluxed under heating for 12 hours. A formed precipitate was washed with methanol and dried in vacuo. To a mixture of 0.40 g of the resulting solid and 0.15 g (1.0 mmoles) of 5-vinyl picolinic acid, 10 mL of N,N-dimethylformamide and 0.14 g (1.0 mmole) of potassium carbonate were added, and the mixture was stirred at 100° C. for 12 hours. The resulting reaction mixture was thrown into 200 mL of water, and a formed precipitate was washed with water and dried in vacuo. The resulting solid was purified by silica gel column chromatography (eluting solution: chloroform/ethyl acetate) to obtain 0.25 g (0.29 mmoles) of Compound (III).

FAB-MS: 861 ($M^+$). Elemental analysis: Calculated for $C_{46}H_{42}IrN_3O_2$: C, 64.16; H, 4.92; N, 4.88. Found: C, 64.51; H, 5.07; N, 4.98.

Synthesis Example 4

Synthesis of bis(5-t-butyl-2-(2-quinolyl)phenyl) (5-vinyl-2-(2-pyridyl)phenyl)iridium (Compound (IV))

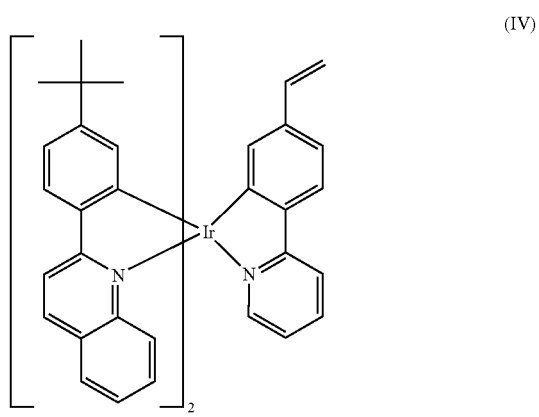

(IV)

To a mixture of 0.68 g (1.9 mmoles) of iridium trichloride trihydrate and 1.1 g (4.2 mmoles) of 2-(4-t-butylphenyl) quinoline, 15 mL of 2-ethoxyethanol and 5 mL of water were added, and the mixture was refluxed under heating for 12 hours. A formed precipitate was washed with methanol and dried in vacuo. To a mixture of 0.60 g of the resulting solid and 0.16 g (0.80 mmoles) of 2-(4-(1-hydroxyethyl)phenyl)pyridine, 20 mL of toluene and 0.21 g (0.82 mmoles) of silver trifluoromethanesulfonate were added, and the mixture was refluxed under heating for 12 hours. The resulting reaction mixture was filtered by Celite, and the solvent was distilled off. The resulting solid was purified by silica gel column chromatography (eluting solution: chloroform) to obtain 0.13 g (0.15 mmoles) of Compound (IV).

FAB-MS: 893 ($M^+$). Elemental analysis: Calculated for $C_{51}H_{46}IrN_3$: C, 68.58; H, 5.19; N, 4.70. Found: C, 68.22; H, 5.30; N, 4.94.

Example 1-1

Synthesis of Copolymer (I)

In a closed vessel, 80 mg of Compound (I), 460 mg of a compound represented by the formula (E13) and 460 mg of a compound represented by the formula (E18) were charged, and 9.9 mL of dehydrated toluene was further charged. Subsequently, 198 μL of a toluene solution of V-601 (manufactured by Wako Pure Industries, Ltd.) (0.1 M) was added to the mixture, and then the mixture was deaerated by five freeze-pump-thaw cycles. The vessel was closed as it was in the vacuum state, and the mixture was stirred at 60° C. for 60 hours. After the reaction, the reaction mixture was added dropwise to 500 mL of acetone to obtain a precipitate. In addition, after repeating reprecipitation purification with toluene-acetone twice, the reaction product was dried in vacuo overnight at 50° C. to obtain Copolymer (I).

Copolymer (I) had a weight average molecular weight (Mw) of 36,500, and a molecular weight distribution (Mw/Mn) of 2.80. Copolymer (I) had a value of m/(m+n), as estimated from the results determined by elemental analysis using ICP-MS and $^{13}$C-NMR spectra, of 0.040. Further, Copolymer (I) had a value of x/n of 0.40 and a value of y/n of 0.60.

Example 1-2

Synthesis of Copolymer (II)

Copolymer (II) was obtained in the same manner as in Example 1-1, except for using Compound (II) in place of Compound (I).

Copolymer (II) had a weight average molecular weight (Mw) of 50,200, and a molecular weight distribution (Mw/Mn) of 2.75. Copolymer (II) had a value of m/(m+n), as estimated from the results determined by elemental analysis using ICP-MS and $^{13}$C-NMR spectra, of 0.044. Further, Copolymer (II) had a value of x/n of 0.38 and a value of y/n of 0.62.

Example 1-3

Synthesis of Copolymer (III)

Copolymer (III) was obtained in the same manner as in Example 1-1, except for using Compound (III) in place of Compound (I), compound represented by the formula (E12) in place of compound represented by the formula (E13) and compound represented by the formula (E25) in place of compound represented by the formula (E18).

Copolymer (III) had a weight average molecular weight (Mw) of 46,700, and a molecular weight distribution (Mw/Mn) of 2.88. Copolymer (III) had a value of m/(m+n), as estimated from the results determined by elemental analysis using ICP-MS and $^{13}$C-NMR spectra, of 0.045. Further, Copolymer (III) had a value of x/n of 0.52 and a value of y/n of 0.48.

Example 1-4

Synthesis of Copolymer (IV)

Copolymer (IV) was obtained in the same manner as in Example 1-3, except for using Compound (IV) in place of Compound (III).

Copolymer (IV) had a weight average molecular weight (Mw) of 48,900, and a molecular weight distribution (Mw/Mn) of 2.73. Copolymer (IV) had a value of m/(m+n), as estimated from the results determined by elemental analysis using ICP-MS and $^{13}$C-NMR spectra, of 0.045. Further, Copolymer (IV) had a value of x/n of 0.50 and a value of y/n of 0.50.

Example 2-1

Preparation of Organic EL Device and Evaluation of Light Emitting Characteristics An substrate with ITO (manufactured by Nippo Electric Co., Ltd.) was used. This was a 25-mm square glass substrate in which two ITO (indium tin oxide) electrodes (anodes) having a width of 4 mm were formed in a striped form on one surface of it.

First of all, poly(3,4-ethylenedioxythiophene)-polystyrenesulfonic acid (a trade name: Baytron P, manufactured by Bayer AG) was coated on the substrate with ITO by spin coating under conditions at a rotation number of 3,500 rpm for a coating time of 40 seconds. Thereafter, the resulting substrate was dried at 60° C. for 2 hours in vacuo in a vacuum dryer to form an anode buffer layer. The resulting anode buffer layer had a thickness of about 50 nm. Next, 90 mg of Copolymer (I) was dissolved in 2,910 mg of toluene (special grade, manufactured by Wako Pure Chemical Industries, Ltd.), and the resulting solution was filtered through a filter having a pore size of 0.2 μm to prepare a coating solution. Next, the coating solution was coated on the anode buffer layer by spin coating under conditions at a rotation number of 3,000 rpm for a coating time of 30 seconds, followed by drying at room temperature (25° C.) for 30 minutes to form a light emitting layer. The resulting light emitting layer had a thickness of about 100 nm.

Next, the substrate having the light emitting layer formed thereon was placed in a vapor deposition unit and then subjected to co-vapor deposition with calcium and aluminum in a weight ratio of 1/10, thereby forming two cathodes having a width of 3 mm in a striped form in a direction perpendicular to the direction of the anodes. The resulting cathodes had a thickness of about 50 nm.

Finally, lead wires (wirings) were installed in the anodes and cathodes in an argon atmosphere to prepare four organic EL devices of 4 mm in length×3 mm in width. A voltage was applied to the organic EL device using a programmable direct current voltage/current source (TR6143, manufactured by Advantest Corporation), thereby emitting the organic EL device. Its luminance brightness was measured using a luminance meter (BM-8, manufactured by Topcon Corporation).

The prepared organic EL device exhibited reddish orange light emission and had a maximum luminous external quantum efficiency of 6.0% and a maximum brightness of 3,100 cd/m$^2$. The organic EL device was caused to emit light at an initial brightness of 100 cd/m$^2$ and was forcibly deteriorated by continuous emission at a constant current. The brightness half life was 3500 hours.

Example 2-2

Preparation of Organic EL Device and Evaluation of Light Emitting Characteristics An organic EL device was prepared and measured with respect to the luminescent color and the luminance brightness in the same manner as in Example 2-1, except for using Copolymer (II) in place of Copolymer (I).

The prepared organic EL device exhibited reddish orange light emission and had a maximum luminous external quantum efficiency of 5.1% and a maximum brightness of 2,500 cd/m$^2$. The organic EL device was caused to emit light at an initial brightness of 100 cd/m$^2$ and was forcibly deteriorated by continuous emission at a constant current. The brightness half life was 1900 hours.

Example 2-3

Preparation of Organic EL Device and Evaluation of Light Emitting Characteristics An organic EL device was prepared and measured with respect to the luminescent color and the luminance brightness in the same manner as in Example 2-1, except for using Copolymer (III) in place of Copolymer (I).

The prepared organic EL device exhibited red light emission and had a maximum luminous external quantum efficiency of 5.0% and a maximum brightness of 2,700 cd/m$^2$. The organic EL device was caused to emit light at an initial brightness of 100 cd/m$^2$ and was forcibly deteriorated by continuous emission at a constant current. The brightness half life was 1600 hours.

Example 2-4

Preparation of Organic EL Device and Evaluation of Light Emitting Characteristics An organic EL device was prepared and measured with respect to the luminescent color and the luminance brightness in the same manner as in Example 2-1, except for using Copolymer (IV) in place of Copolymer (I).

The prepared organic EL device exhibited reddish orange light emission and had a maximum luminous external quantum efficiency of 6.2% and a maximum brightness of 3,500 cd/m$^2$. The organic EL device was caused to emit light at an initial brightness of 100 cd/m$^2$ and was forcibly deteriorated by continuous emission at a constant current. The brightness half life was 4700 hours.

The invention claimed is:

1. A light emitting polymer material comprising a (co)polymer comprising a structural unit derived from an iridium complex represented by the following formula (IV):

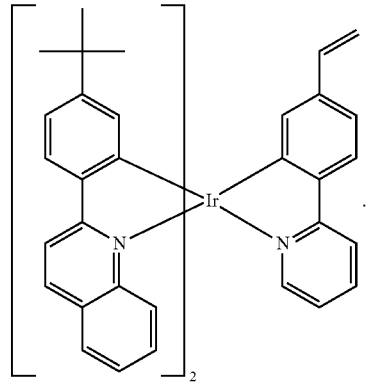

(IV)

2. The light emitting polymer material as claimed in claim 1, wherein the (co)polymer further comprises a structural unit derived from at least one hole transport polymerizable compound.

3. The light emitting polymer material as claimed in claim 1, wherein the (co)polymer further comprises a structural unit derived from at least one electron transport polymerizable compound.

4. An organic EL device comprising one layer or two or more layers of an organic polymer compound layer interposed between an anode and a cathode, wherein at least one of the organic polymer compound layers comprises the light emitting polymer material as claimed in claim 1.

5. An image display device comprising the organic EL device as claimed in claim 4.

6. An area light source comprising the organic EL device as claimed in claims 4.

* * * * *